United States Patent [19]

Kim

[11] Patent Number: 5,717,227
[45] Date of Patent: Feb. 10, 1998

[54] BIPOLAR JUNCTION TRANSISTORS HAVING INSULATED GATE ELECTRODES

[75] Inventor: Gyu-chul Kim, Seoul, Rep. of Korea

[73] Assignee: Samsung Electronics Co., Ltd., Suwon, Rep. of Korea

[21] Appl. No.: 666,025

[22] Filed: Jun. 19, 1996

[30] Foreign Application Priority Data

Jun. 29, 1995 [KR] Rep. of Korea ............... 95-18118

[51] Int. Cl.$^6$ ............... H01L 29/74; H01L 31/111; H01L 27/082; H01L 27/102
[52] U.S. Cl. .................................. 257/139; 257/593
[58] Field of Search ............................ 257/139, 593

[56] References Cited

U.S. PATENT DOCUMENTS

| 4,669,177 | 6/1987 | D'Arrigo | 257/593 |
| 5,162,966 | 11/1992 | Fujihira | 257/139 |

Primary Examiner—Stephen Meier
Attorney, Agent, or Firm—Myers, Bigel, Sibley & Sajovec, L.L.P.

[57] ABSTRACT

Methods of forming bipolar junction transistors include the step of forming insulated gate electrode means adjacent the base region of the transistor so that the majority carrier conductivity of the base region and the gain (β) of the transistor can be modulated in response to a gate bias. The methods can include the steps of forming an insulated gate electrode containing a conductive gate on a face of a substrate and then forming a base region in the substrate. These steps can then be followed by the steps of patterning the insulated gate electrode to define an opening which exposes a first portion of the base region at the face and then forming an emitter electrode in the opening. The emitter electrode and conductive gate are preferably formed to be in electrical contact so that during operation, the potential of the emitter electrode and conductive gate are maintained at the same level. The emitter electrode is preferably a semiconductor containing first conductivity type dopants which can be diffused into the base region to define an emitter region.

18 Claims, 3 Drawing Sheets

BIPOLAR JUNCTION TRANSISTORS HAVING INSULATED GATE ELECTRODES

FIELD OF THE INVENTION

The present invention relates to semiconductor devices and methods of fabrication, and more particularly to bipolar junction transistors and methods of forming bipolar junction transistors.

BACKGROUND OF THE INVENTION

Methods of forming integrated circuits containing combinations of complementary-metal-oxide-semiconductor (CMOS) devices and bipolar junction transistor (BJT) devices have been extensively studied because they can provide the capability of simultaneously obtaining the preferred operating characteristics and features of CMOS and BJT devices relating to speed, integration density and power consumption, for example. Methods of forming these devices are typically referred to as BiCMOS methods to denote that bipolar junction transistors and MOS related devices can be simultaneously formed on a single semiconductor substrate, including bulk and silicon-on-insulator (SOI) substrates.

One such prior art BiCMOS method is illustrated at FIGS. 1A-1D. In particular, FIG. 1A illustrates steps for forming a field oxide layer 3 on a semiconductor substrate 1 of first conductivity type to define an active region of the substrate 1 containing a collector region therein, and then forming a gate insulating layer 5 (e.g., $SiO_2$) on the active region portion of the substrate and a gate pattern 7 on the gate insulating layer 5. The gate insulating layer 5 may be formed by thermal oxidation of the face of the substrate and the gate pattern 7 may be formed by depositing and then patterning a conductive layer. The gate pattern may comprise polycrystalline silicon or a tungsten polycide composed of the polycrystalline silicon and tungsten silicide. Referring now to FIG. 1 B, an insulating spacer 9 is then formed on sidewalls of the gate pattern 7 by depositing an oxide layer using chemical-vapor-deposition (CVD) and then anisotropically etching the oxide layer. A photoresist layer 11 is also patterned to expose the gate pattern 7 having insulating spacers 9.

Referring now to FIG. 1C, the exposed gate pattern 7 is then etched from those active regions where bipolar junction transistors are to be formed using the photoresist layer 11 as a mask. During this etching step, portions of the field oxide layer 3 and spacer 9 are also etched to thereby define a modified field oxide layer 3a and modified spacer 9a which collectively form a surface having relatively severe surface roughness. As will be understood by those skilled in the art, etching damage may also be generated at the surface of the active region during removal of the gate pattern 7. Following the etching step, dopants of second conductivity type are implanted and diffused into the active region to form a base region 13, using the field oxide layer 3a as a mask. Then, as illustrated by FIG. 1D, the photoresist layer 11 is removed and followed by another step of implanting second conductivity type dopants at a higher dose to define an extrinsic (inactive) base region 15 and an intrinsic (active) base region 13a. In particular, the extrinsic base region 15 is doped highly to facilitate formation of a base electrode in ohmic contact therewith.

Following these base forming steps, a dielectric insulating layer 17 is formed over the active region and field oxide layer 3a and then etched to expose the intrinsic base region 13a. Then, an emitter electrode layer of first conductivity type is applied on top of the dielectric insulating layer 17 and patterned to form an emitter electrode 19. The emitter electrode layer may comprise polycrystalline silicon or tungsten polycide, for example. The emitter electrode 19 is then thermally treated to cause the diffusion of first conductivity type dopants therein into the intrinsic base region 13a to form an emitter region 21 which extends laterally underneath the modified gate insulating layer 5a. As will be understood by those skilled in the art, the emitter, base and collector regions collectively form a bipolar junction transistor.

Unfortunately, the above described etching damage and surface roughness may cause deterioration of the electrical characteristics of the base region and deteriorate the reliability of subsequently formed layers (e.g., metal wiring layers). Thus, notwithstanding the above prior art BiCMOS method of forming bipolar junction transistors, there still continues to be a need for methods which do not result in the above described surface roughness and deterioration of base region characteristics, which can decrease the gain of the bipolar junction transistor and reduce yield.

SUMMARY OF THE INVENTION

It is therefore an object of the present invention to provide improved methods of forming bipolar junction transistors and transistors formed thereby.

It is another object of the present invention to provide improved methods of forming bipolar junction transistors which are compatible with methods of forming BiCMOS devices.

It is still another object of the present invention to provide methods of forming bipolar junction transistors with increased and variable gain ($\beta$) and transistors formed thereby.

These and other objects, features and advantages of the present invention are provided by methods of forming bipolar junction transistors which include the step of forming insulated gate electrode means adjacent the base region of the transistor so that the majority carrier conductivity of the base region and the gain ($\beta$) of the transistor can be modulated in response to a gate bias. In particular, the methods preferably include the steps of forming an insulated gate electrode containing a conductive gate on a face of a substrate containing a collector region therein and then forming a base region in the substrate, between the collector region and the insulated gate electrode. These steps are then followed by the steps of patterning the insulated gate electrode to define an opening which exposes a first portion of the base region at the face and then forming an emitter electrode in the opening. The emitter electrode and conductive gate are preferably formed to be in electrical contact so that during operation, the potential of the emitter electrode and conductive gate are maintained at the same level. However, the emitter electrode and 15 conductive gate may be electrically insulated from each other to provide a four terminal bipolar junction transistor. The emitter electrode is preferably a semiconductor containing first conductivity type dopants which can be diffused into the base region to define an emitter region. The base region is also preferably divided into extrinsic and intrinsic regions which are preferably formed by implanting second conductivity type dopants through the insulated gate electrode and/or into the substrate using the insulated gate electrode as an implant mask.

DESCRIPTION OF PREFERRED EMBODIMENTS

Figure 1A:
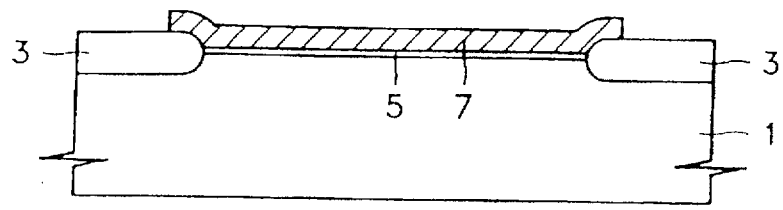
FIGS. 1A-1 D illustrate schematic cross-sectional views of intermediate structures illustrating a method of forming a bipolar junction transistor (BJT) according to the prior art.
Figure 1B:
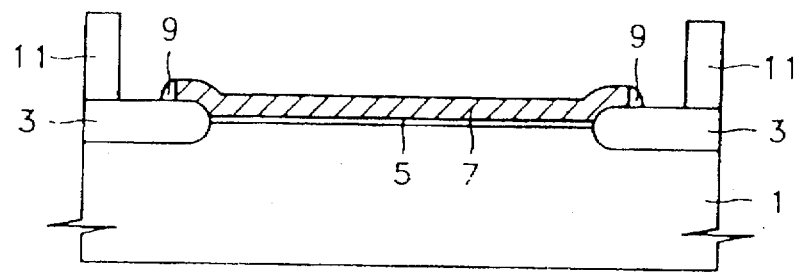
Figure 1C:
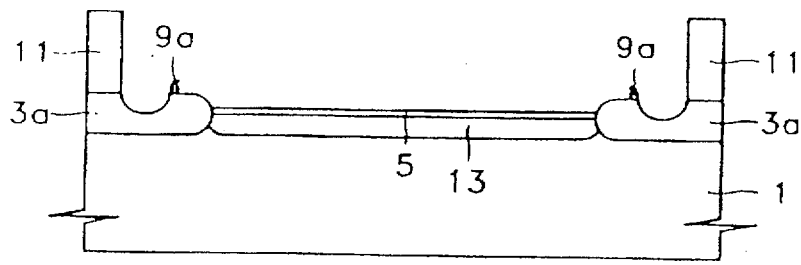
Figure 1D:
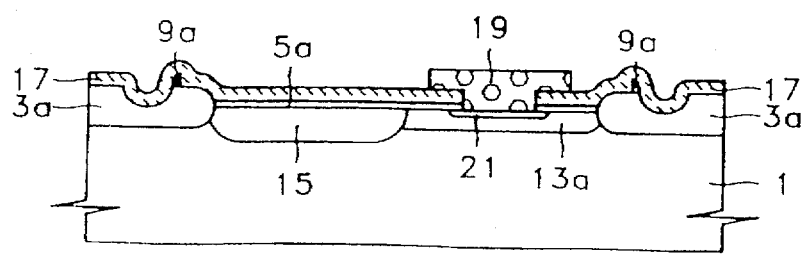

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well.

Figure 2:
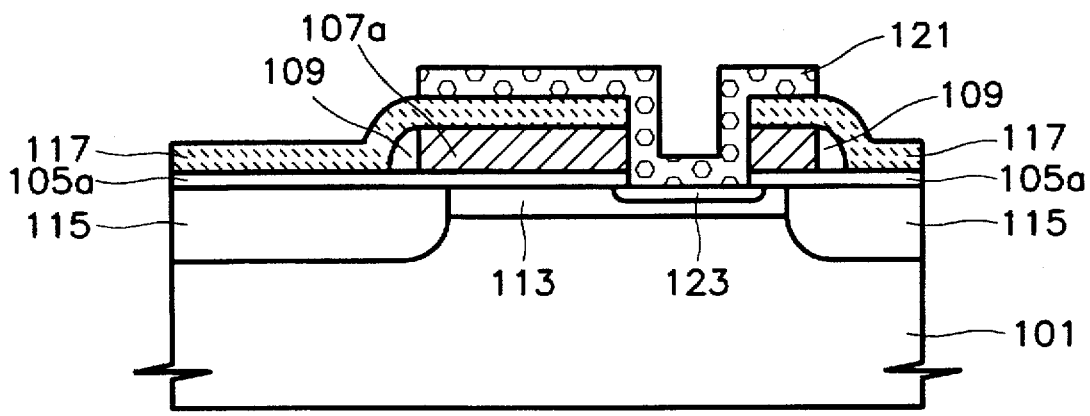
FIG. 2 illustrates a cross-sectional view of a bipolar junction transistor according to an embodiment of the present invention.
Figure 3A:
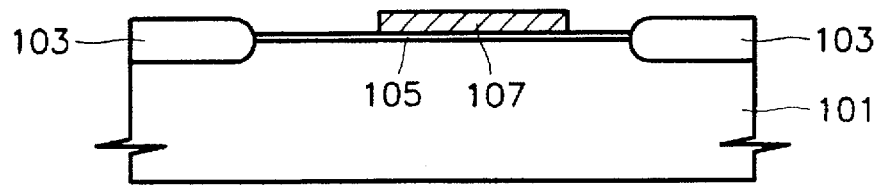
FIGS. 3A–3D illustrate schematic cross-sectional views of intermediate structures illustrating a method of forming a bipolar junction transistor according to the embodiment of FIG. 2.

Referring now to FIGS. 2 and 3A–3D, methods of forming bipolar junction transistors (BJTs) according to the present invention will be described. In particular, FIG. 3A illustrates the preferred steps of forming a gate insulating layer 105 (e.g., $SiO_2$) on a face of a substrate containing a collector region 101 of first conductivity type semiconductor (e.g., N-type silicon) therein. As will be understood by those skilled in the art, the collector region 101 may be formed in a silicon-on-insulator (SOI) substrate or as a first conductivity type well in a bulk semiconductor substrate, for example. As illustrated, the gate insulating layer 105 is preferably formed over an active region of the substrate which is defined in an opening in a relatively thick field oxide insulating layer 103. The gate insulating layer 105 may be formed using conventional thermal oxidation techniques, for example. A conductive layer is then formed on the gate insulating layer and patterned using conventional photolithography and etching techniques to form a gate electrode 107 on a predetermined portion of the gate insulating layer 105. The conductive layer is preferably formed to have a relatively high first conductivity type doping concentration therein. The conductive layer may comprise electrically conductive materials such as polycrystalline silicon or a tungsten polycide composite of polycrystalline silicon and tungsten silicide ($WSi_x$), for example. As illustrated, the gate electrode 107 is electrically insulated from the collector region 101 by the gate insulating layer 105. Accordingly, the gate electrode 107 and the predetermined portion of the gate insulating layer 105 collectively form an insulated gate electrode.

Figure 3B:
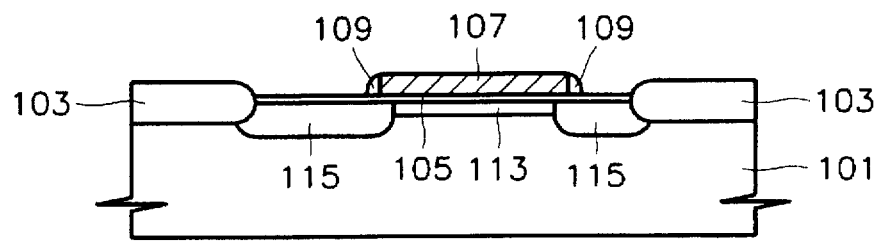

Referring now to FIG. 3B, an insulating layer is preferably formed on the structure illustrated in FIG. 3A and then patterned by anisotropic etching to form insulating spacers 109 (e.g., $SiO_2$) on outside sidewalls of the gate electrode 107. The insulating layer may be formed by depositing a silicon dioxide layer using chemical vapor deposition (CVD), for example. Next, dopants of second conductivity type (e.g., P-type) are directed to the face at a first energy level and dose level to form a layer of second conductivity type dopants in the active region of the substrate, at the face. In particular, to form an N-P-N bipolar junction transistor, boron atoms at a dose level of $3 \times 10^{13}$ ions/cm$^2$ can be implanted into the face with sufficient energy to penetrate the gate electrode 107 and underlying gate insulating layer 105. Next, dopants of second conductivity type are preferably directed to the face again at a second implant energy level and dose level. These dopants may comprise boron flouride ions. The implanted second conductivity type dopants are then driven into the substrate using conventional techniques to form an extrinsic (inactive) base region 115 and also form an intrinsic (active) base region 113 which extends opposite the patterned gate electrode 107, as illustrated. To achieve a more highly doped extrinsic base region 115 relative to the intrinsic base region 113, the second energy level is less than the first energy level. Preferably, the second energy level is sufficiently low so that the boron flouride ions, for example, do not penetrate the patterned gate electrode 107 which acts as a mask. The second dose level may also be higher than the first dose level to achieve a highly conductive and relatively deep extrinsic base region 115. As will be understood by those skilled in the art, the implantation of second conductivity type dopants into the gate electrode 107 may cause the second conductivity type doping concentration in the gate electrode 107 to increase, however, the gate electrode 107 is initially formed to have a relatively high first conductivity type dopant concentration therein which easily compensates for the implanted second conductivity type dopants. Alternatively, a base region of second conductivity type may be formed in the collector region 101 prior to forming the gate insulating layer 105 and gate electrode 107 on the face.

Figure 3C:
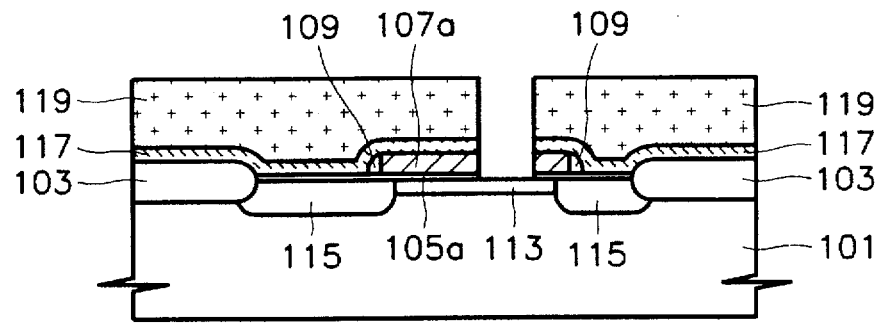
Figure 3D:
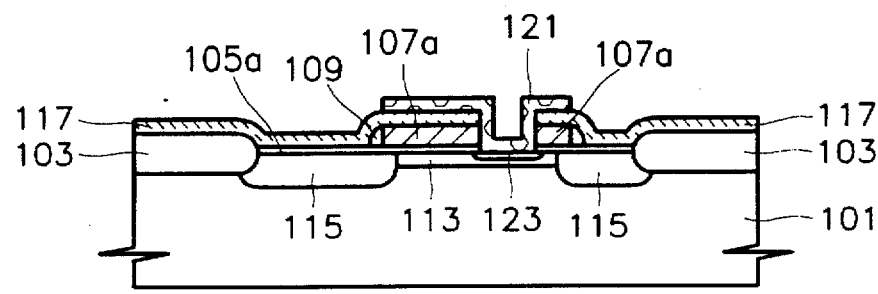

Referring now to FIGS. 3C–3D, an electrically insulating layer 117 is formed on the gate electrode 107, sidewall spacers 109, gate insulating layer 105 and field insulating layer 103. The electrically insulating layer 117 may be formed by blanket deposition of an oxide (e.g., $SiO_2$). Next, a blanket photoresist layer 119 is formed and then patterned. The patterned photoresist layer 119 is then used as a mask during an etching step to define an opening extending through the electrically insulating layer 117, gate electrode 107 and gate insulating layer 105 (shown as 105a) and thereby expose a portion of the intrinsic base region 113 at the face. The opening also exposes sidewalls of the gate electrode 107a, as illustrated. The patterned photoresist layer 119 is then removed and followed by the step of forming an emitter electrode 121 in the opening, preferably by depositing and patterning polycrystalline silicon or tungsten polycide. As illustrated, the emitter electrode 121 preferably electrically contacts the sidewalls of the gate electrode 107a. According to a preferred embodiment of the present invention, the emitter electrode 121 contains dopants therein of first conductivity type (e.g., N-type) so that during a subsequent thermal drive-in step, first conductivity type dopants diffuse from the emitter electrode 121 into the intrinsic base region 113 to thereby form a shallow emitter region 123 of first conductivity type. As will be understood by those skilled in the art, the duration of the drive-in step is preferably chosen to obtain a preferred base width (i.e., the distance between the emitter/base P-N junction and base/collector P-N junction). Conventional techniques can also be used to define additional openings in the insulating layer 117 and form base electrodes and collector electrodes to the extrinsic base region 115 and collector region 101, respectively. Alternatively, the sequence of forming the emitter electrode 121 first and then forming the emitter region 123 may be reversed by implanting first conductivity type dopants directly into the intrinsic base region 113 at the opening, using the photoresist layer 119 as a mask, and then forming the emitter electrode 121 on the emitter region 123. However, this latter step sequence is less preferred.

The operation of the preferred bipolar junction transistor of FIG. 2 and 3D will now be described. The operation of the bipolar junction transistor is similar to conventional bipolar junction transistors, however, the gate electrode 107a is added to provide means for increasing the majority carrier conductivity of the intrinsic base region 113 during operation of the transistor. In particular, in the case of an N-P-N bipolar junction transistor, the gate electrode 107a can be biased negatively with respect to the intrinsic base region 113 to thereby cause the formation of a highly conductive surface accumulation layer of second conductivity type charge carriers (e.g., holes) in the intrinsic base region 113. Accordingly, the gate electrode 107a can be used to modulate the resistance of the intrinsic base region 113 and modulate (e.g., increase) the gain ($\beta_{n-p-n}$) of the transistor. The gate electrode 107a may be controlled as a separate electrode by forming insulating spacers on the inner sidewalls of the gate electrode 107a prior to forming the emitter electrode 121 in the opening or using similar techniques to electrically isolated the gate electrode 107a from the emitter electrode 121. Preferably, however, the gate electrode 107a becomes electrically connected to the emitter electrode 121 during fabrication, as described above with respect to FIGS. 3A–3D, so that when the base-to-emitter voltage ($V_{be}$) is positive, the potential between the intrinsic base region and gate electrode 107a will also equal $V_{be}$. The above described device is ideally suited for BiCMOS applications because the additional step of forming the insulated gate electrode over the intrinsic base region can be performed simultaneously with the steps of forming the CMOS device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A bipolar junction transistor, comprising:
   a collector region of first conductivity type semiconductor;
   a base region of second conductivity type semiconductor on said collector region and forming a first P-N junction therewith;
   an emitter region of first conductivity type semiconductor on said base region and forming a second P-N junction therewith;
   base and collector electrodes electrically connected to said base and collector regions, respectively, and electrically isolated from each other;
   insulated gate electrode means adjacent said base region for increasing a majority carrier conductivity of said base region upon application of a first potential bias thereto;
   an electrically insulating layer on said insulated gate electrode means, opposite said base region;
   an emitter contact hole extending through said insulated gate electrode means and said electrically insulating layer; and
   an emitter electrode on a portion of said electrically insulating layer extending opposite said insulated gate electrode means and in said emitter contact hole in electrical contact with said emitter region.

2. The bipolar junction transistor of claim 1, wherein said insulated gate electrode means comprises an electrically insulating layer on said base region and a conductive gate on said electrically insulating layer, opposite said base region; and wherein said conductive gate is electrically connected to said emitter electrode.

3. The bipolar junction transistor of claim 2, wherein said conductive gate is of first conductivity type.

4. The bipolar junction transistor of claim 2, wherein said base region comprises an intrinsic base region and an extrinsic base region; wherein a second conductivity type doping concentration in said extrinsic base region is greater than a second conductivity type doping concentration in said intrinsic base region; wherein the second P-N junction is formed between said emitter region and said intrinsic base region; and wherein said gate electrode extends opposite said intrinsic base region and said extrinsic base region so that upon application of the first potential bias, the majority carrier conductivity of said intrinsic base region is increased.

5. The transistor of claim 1, wherein said insulated gate electrode means and said emitter electrode are electrically insulated from each other by insulating spacers in the emitter contact hole.

6. A bipolar junction transistor, comprising:
   a semiconductor substrate having a face thereon;
   a collector region of first conductivity type in said semiconductor substrate;
   a base region of second conductivity type in said collector region and extending to the face;
   an emitter region of first conductivity type in said base region and extending to the face;
   base and collector electrodes electrically connected to said base and collector regions, respectively;
   a first electrically insulating layer on said base region, at the face;
   a gate electrode on the first electrically insulating layer, opposite said base region;
   a second electrically insulating layer on said gate electrode, opposite said first electrically insulating layer; and
   an emitter electrode electrically connected to said emitter region at the face, at an opening in said second electrically insulating layer, said gate electrode and said first electrically insulating layer.

7. The bipolar junction transistor of claim 6, wherein said emitter electrode is electrically connected to said gate electrode.

8. The bipolar junction transistor of claim 7, wherein said emitter electrode is electrically connected to said gate electrode at a sidewall thereof.

9. The bipolar junction transistor of claim 8, wherein said gate electrode is of first conductivity type.

10. The bipolar junction transistor of claim 8, wherein said base region comprises an intrinsic base region and an extrinsic base region; wherein a second conductivity type doping concentration in said extrinsic base region is greater than a second conductivity type doping concentration in said intrinsic base region; wherein said gate electrode extends opposite said extrinsic and intrinsic base regions; and wherein said base electrode is ohmically connected to said extrinsic base region.

11. The bipolar junction transistor of claim 8, wherein said emitter region is self-aligned to the opening.

12. The bipolar junction transistor of claim 6, wherein said gate electrode is of first conductivity type.

13. The transistor of claim 6, wherein said gate electrode and said emitter electrode are electrically insulated from each other by insulating spacers in the opening.

14. A bipolar junction transistor, comprising:

a semiconductor substrate having a face thereon;

a collector region of first conductivity type in said semiconductor substrate;

a base region of second conductivity type disposed between said collector region and the face, said base region comprising an intrinsic base region of first conductivity and an extrinsic base region of second conductivity greater than the first conductivity;

an emitter region of first conductivity type in said intrinsic base region and extending to the face;

a first electrically insulating layer on the face, opposite said intrinsic and extrinsic base regions;

a gate electrode on the first electrically insulating layer, opposite said intrinsic and extrinsic base regions;

a second electrically insulating layer on said gate electrode, opposite said first electrically insulating layer;

an emitter contact hole extending through said second electrically insulating layer, said gate electrode and said first electrically insulating layer; and an emitter electrode in said emitter contact hole and electrically connected to said emitter region at the face.

15. The transistor of claim 14, wherein said emitter electrode extends on said second electrically insulating layer, opposite said gate electrode.

16. The transistor of claim 15, wherein said emitter electrode is electrically connected to said gate electrode in said emitter contact hole.

17. The transistor of claim 15, wherein said emitter electrode extends on said second electrically insulating layer, opposite a portion of said extrinsic base region.

18. The transistor of claim 14, wherein said gate electrode and said emitter electrode are electrically insulated from each other by insulating spacers in the emitter contact hole.

* * * * *

UNITED STATES PATENT AND TRADEMARK OFFICE
CERTIFICATE OF CORRECTION

PATENT NO. : 5,717,227
DATED : February 10, 1998
INVENTOR(S) : Kim

It is certified that error appears in the above-identified patent and that said Letters Patent is hereby corrected as shown below:

Column 2, line 52 Please delete "15".

Column 6, line 61 Please delete "8" and substitute -- 10 -- therefor.

Signed and Sealed this

Eleventh Day of May, 1999

*Attest:*

Q. TODD DICKINSON

*Attesting Officer*  Acting Commissioner of Patents and Trademarks